United States Patent [19]
Igura

[11] Patent Number: 6,066,988
[45] Date of Patent: May 23, 2000

[54] PHASE LOCKED LOOP CIRCUIT WITH HIGH STABILITY HAVING A RESET SIGNAL GENERATING CIRCUIT

[75] Inventor: Hiroyuki Igura, Tokyo, Japan

[73] Assignee: NEC Corporation, Tokyo, Japan

[21] Appl. No.: 09/134,537

[22] Filed: Aug. 14, 1998

[30] Foreign Application Priority Data

Aug. 20, 1997 [JP] Japan ................................ 9-222878

[51] Int. Cl.[7] .............................. H03L 7/06; H03L 7/08; H03L 7/099; H03L 7/18
[52] U.S. Cl. ................................ 331/18; 331/1 A; 331/8; 331/25; 331/57; 331/173; 327/142; 327/156; 327/157; 327/158; 327/159
[58] Field of Search .................................. 331/1 A, 8, 18, 331/25, 57, 173; 327/142, 156–159

[56] References Cited

U.S. PATENT DOCUMENTS 5,495,205  2/1996  Parker et al. ............................ 331/1 A

FOREIGN PATENT DOCUMENTS

| 44-12365 | 6/1969 | Japan . |
| 51-6515 | 1/1976 | Japan . |
| 60-9223 | 1/1985 | Japan . |
| 63-116520 | 5/1988 | Japan . |
| 63-290019 | 11/1988 | Japan . |
| 64-44123 | 2/1989 | Japan . |
| 64-77329 | 3/1989 | Japan . |
| 4-271634 | 9/1992 | Japan . |
| 5-41636 | 2/1993 | Japan . |
| 7-86931 | 3/1995 | Japan . |

OTHER PUBLICATIONS

Hata et al., "How to Use PLL–IC", published from Akiba syuppan on Feb. 10, 1986, pp. 21 to 24 and pp. 75 to 78.

*Primary Examiner*—David Mis
*Attorney, Agent, or Firm*—McGinn & Gibb, P.C.

[57] ABSTRACT

A phase locked loop circuit includes a reset signal generating circuit for generating a reference clock signal and a reset signal from an input clock signal. A phase locked loop section generates an output clock signal based on the reference clock signal such that a phase of the output clock signal is locked in that of the reference clock signal. Also, the phase locked loop section is reset in response to the reset signal such that the phase of the output clock signal is locked in an initial value.

20 Claims, 13 Drawing Sheets

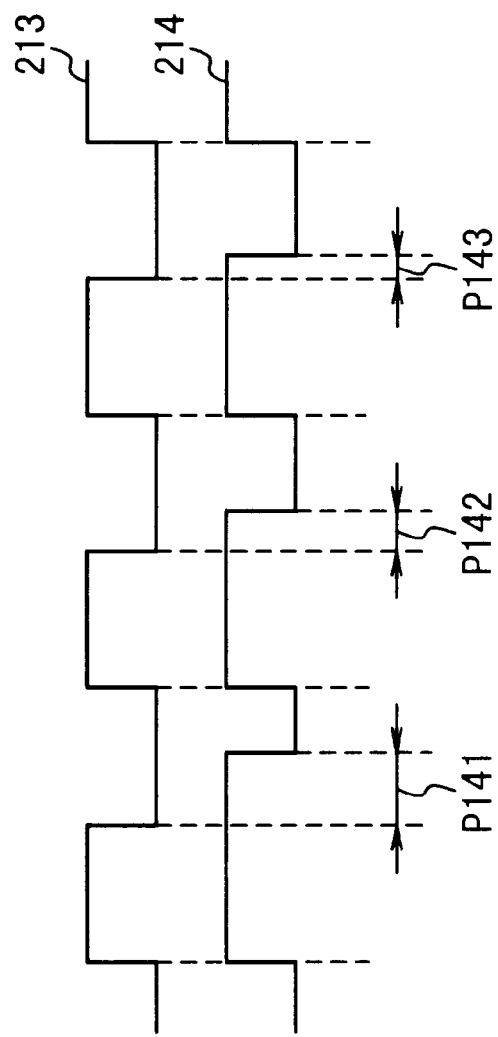
Fig. 16A RCLK
Fig. 16B SCLK

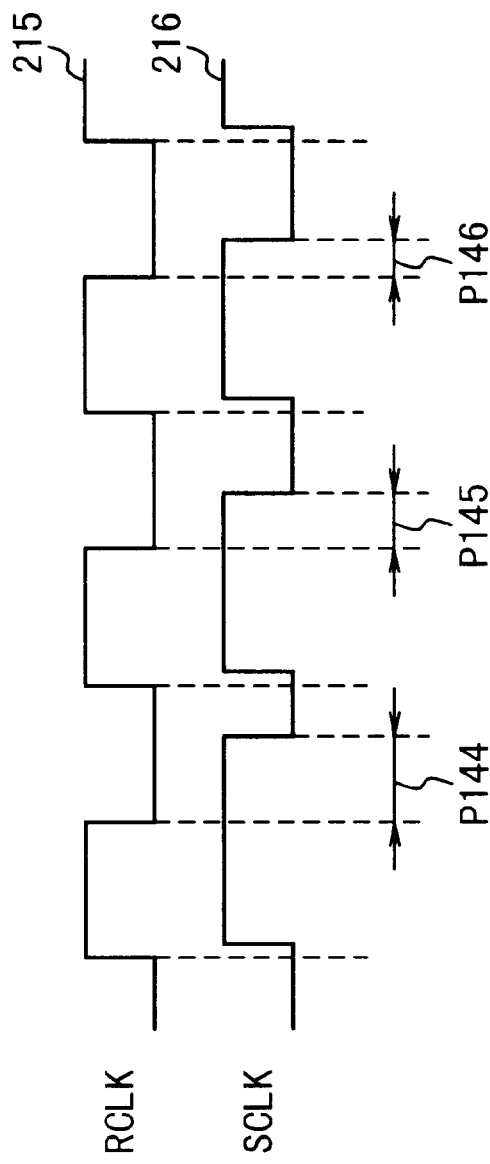
Fig. 17A RCLK
Fig. 17B SCLK

PHASE LOCKED LOOP CIRCUIT WITH HIGH STABILITY HAVING A RESET SIGNAL GENERATING CIRCUIT

BACKGROUND OF THE INVENTION

1. Field of the Invention

The present invention relates to a phase locked loop (to be referred to as a PLL, hereinafter) circuit, and more particularly to a PLL circuit which generates a clock signal to be supplied to an LSI (Large Scale Integrated Circuit).

2. Description of the Related Art

A PLL circuit of this type is conventionally used to generate a clock signal which is used in an LSI circuit. The structure of the PLL circuit which is used as a conventional clock signal frequency multiplying circuit is explained in "How to use PLL-IC" by Hata et al., (published from Akiba syuppan on Feb. 10, 1986, pp. 21 to 24 and pp. 75 to 78). In this reference, there is described a basic PLL circuit which is composed of a phase comparator, a loop filter and a voltage controlled oscillator, and a basic operation of the PLL circuit such as basic equations and a pull-in range in case of existing a delay time in a loop circuit.

FIG. 1 is a block diagram illustrating the structure of a conventional PLL circuit. As shown in FIG. 1, in the conventional PLL circuit, an output clock signal CLKOUT (terminal 133) is generated by a voltage controlled oscillator 45 and is frequency-divided by a frequency dividing circuit 46 to produce a synchronous clock signal SCLK (terminal 134). Then, the synchronous clock signal SCLK and an input clock signal CLKIN (terminal 130) are compared with each other by a phase comparator 43 to produce a phase difference signal U/D (terminal 131). A loop filter 44 removes a high frequency component from the phase difference signal U/D to produce a control signal CTR (terminal 132). The frequency of the output clock signal CLKOUT from the voltage controlled oscillator 45 is controlled based on the control signal CTR. As a result, the voltage controlled oscillator 45 is controlled in such a manner that the frequency difference between the input clock signal CLKIN and the synchronous clock signal SCLK and the phase difference between them are eliminated. Thus, the synchronous clock signal SCLK and the input clock signal CLKIN are made equal in frequency and phase.

Because the synchronous clock signal SCLK is obtained by dividing the output clock signal CLKOUT in frequency, the output clock signal CLKOUT has the frequency obtained by multiplying the frequency of the synchronous clock signal SCLK by a reciprocal of a division ratio of the frequency dividing circuit 46, e.g., 2 when the division ratio is ½. After all, the frequency of the output clock signal CLKOUT is obtained by multiplying the frequency of the input clock signal CLKIN by the reciprocal of the dividing ratio of frequency dividing circuit 46. By such a function, the PLL circuit can output the output clock signal which has the frequency N (N is a positive integer) times more than the frequency of the input clock signal.

In the structure of the above-mentioned conventional PLL circuit, there is a problem in that the reliability to the change of external parameters is low. In the conventional PLL circuit, the frequency of the output clock signal is controlled using a feedback control mechanism.

It is known that the feedback control mechanism becomes impossible to perform the control since the control signal diverges and oscillate when a loop gain is equal to or more than 1.

In the PLL circuit using a feedback control system, for example, there are a lot of control parameters such as gains of components such a phase comparator, a loop filter and a voltage controlled oscillator, and a phase delay value. Each of the parameters changes depending upon external parameters such as a power supply voltage, a temperature, a frequency. For this reason, in order to guarantee the control operation of the PLL circuit to the external parameters in an operation guarantee range, it is necessary to guarantee that all of combinations of the control parameters which are set by the external parameters in the operation guarantee range meet the condition for the feedback control.

Therefore, it is desirable that the operation guarantee range to the external parameter is wide. For this purpose, the following two methods could be considered, ① it is to suppress the change of inner parameters depending upon the external parameters, and ② it is to take a wide margin of the control operation condition for the change of the inner parameters.

As a cause by which the loop gain in the feedback loop control mechanism is equal to or more than 1, there would be the case where the loop phase delay quantity becomes equal to or more than π (180 degrees). In this case, because the loop which is originally a negative feed back becomes a positive feedback loop, the loop gain becomes equal to or more than 1 so that it becomes impossible to perform the control.

This loop phase delay is expressed as a summation of the phase delays of the respective components in the loop. In the feedback loop system which is used in a usual PLL circuit for the frequency multiplication, the phase delay quantity of the voltage controlled oscillator becomes π/2 theoretically, because it is an integration term of phase. Also, the phase delay quantity of the loop filter takes a value in a range of 0 to π/2 theoretically, because the loop filter is necessary to form a low-pass filter. However, it is desirable that the dumping constant value of the loop filter is larger, in order to suppress the change (jitter) of the time period of the output clock signal due to the change of the control signal in one control time period. As the result, the phase delay quantity of the loop filter needs to be set to a large value to some extent.

From the above-mentioned reasons, the loop phase delay in the usual PLL circuit for frequency multiplication becomes the value which is near π. Therefore, the phase margin is small so that the reliability to the change of the external parameters becomes low.

The above-mentioned state will be described below more specifically. FIGS. 2A to 2E show operation waveforms in the conventional PLL circuit for frequency multiplication. The waveform 217 in FIG. 2A shows the waveform at a terminal 130 in FIG. 1, the waveform 218 shows the waveform at a terminal 134, the waveform 219 shows the waveform at a terminal 131, the waveform 220 shows the waveform at a terminal 132, and the waveform 221 shows the waveform at a terminal 133. It should be noted that the symbols of "P161" to "P165" in FIGS. 2A to 2E are phase errors between the input clock signal CLKIN and the synchronous clock signal SCLK.

In FIGS. 2A to 2E, the time period of the synchronous clock signal SCLK in the fifth time period of the input clock signal CLKIN shown in FIG. 2A as ⑤ is already shorter than the time period of the input clock signal CLKIN. In spite of this, the phase error shows that the synchronous clock signal SCLK is delayed in phase.

Therefore, it would be expected that the delay time control signal CTR for the voltage controlled oscillator becomes a further smaller value so that the time period of the synchronous clock signal SCLK will become shorter. This is because the phase error had accumulated because of the integration term in the voltage controlled oscillator 45 so that a right phase error could not be detected, i.e., the delay of the phase error detection occurs. Thus, when the delay of the phase error detection is large, divergence or oscillation is brought about in the phase control so that the phase synchronization cannot be accomplished. This is instability in the loop phase delay.

In this way, in the conventional PLL circuit, because the instability is brought about due to this loop phase delay, there is a problem in that the erroneous operation by the change of the external parameters is brought about.

In Japanese Laid Open Patent Application (JP-A-Showa 63-290019), a frequency synthesizer is described. In this reference, when a switch 56 is turned off to open a phase locked loop circuit, a reset signal is supplied to a variable frequency dividing circuit 52 to change the divided frequency into a first predetermined frequency in a first time period and into a second predetermined frequency for second predetermined time periods after the first time period. The phase difference is detected during the second predetermined time periods and the variable frequency dividing circuit 52 is set to output a third frequency. Then, the switch 56 is turned on to form a closed phase locked loop circuit. In this manner, the phase difference detecting operation is performed in the opened phase locked loop state.

In Japanese Laid Open Patent Application (JP-A-Heisei 7-86931) is described a frequency synthesizer which can shorten a pull in time in case of change of frequency. In this reference, the frequency synthesizer is composed of a basic oscillator 4, a voltage controlled oscillator 1, a programmable counter 2, a charge pump type phase comparator 6, a loop filter 7 and an adder 8. In order to change a frequency, a frequency setting of the programmable counter 2 and a voltage setting of a reference voltage generating circuit 9 are changed. Also, a reset signal synchronous with a signal from the basic oscillator 4 in phase is supplied to the programmable counter 2. At the same time, a switching circuit 5 connected to inputs of the phase comparator 6 is operated. Thus, it is made possible to perform a fast pull-in operation even if an output frequency of the voltage controlled oscillator 1 is changed due to an ambient temperature.

As described above, in the conventional PLL circuit, the instability due to the external parameters is not yet sufficiently eliminated.

SUMMARY OF THE INVENTION

The present invention is accomplished to solve the problems in the above-mentioned conventional PLL circuit. An object of the present invention is to provide a phase locked loop circuit which has high reliability to the change of external parameters.

In order to achieve an aspect of the present invention, a phase locked loop circuit includes a reset signal generating circuit for generating a reference clock signal and a reset signal from an input clock signal. A phase locked loop section generates an output clock signal based on the reference clock signal such that a phase of the output clock signal is locked in that of the reference clock signal. Also, the phase locked loop section is reset in response to the reset signal such that the phase of the output clock signal is locked in an initial value.

The reset signal generating circuit generates the reset signal in a predetermined time period. The predetermined time period may be substantially same as a time period of the reference clock signal. The reset signal generating circuit may include a delay element section for delaying the input clock signal to generate the reference clock signal, and a gate circuit for generating the reset signal from the input clock signal and the delayed input clock signal.

The phase locked loop section may desirably include a phase comparing section for generating a control signal based on a phase difference between the reference clock signal and a synchronous clock signal, a voltage controlled oscillator section for oscillating to generate the output clock signal in response to the control signal, wherein the voltage controlled oscillator section is reset in response to the reset signal such that the phase of the output clock signal is locked in the initial value, and a frequency dividing circuit for dividing the output clock signal in frequency to generate the synchronous clock signal.

In this case, the phase comparing section outputs a pulse signal of a signal level for a time period for which a signal level of the synchronous clock signal and a signal level of the reference clock signal are different from each other, and holds the signal level of the outputted pulse signal for a time period for which the signal level of the synchronous clock signal is same as that of the reference clock signal. The phase comparing section includes an output section composed of a P-channel MOS transistor and an N-channel MOS transistor which are connected in series between a power supply level and a ground level, wherein the output section outputs a signal indicative of the phase difference corresponding to the control signal when at least one of the P-channel MOS transistor and the N-channel MOS transistor is driven, first and second inverter circuits for inverting the synchronous clock signal and the reference clock signal, respectively, a first gate circuit for driving the P-channel MOS transistor based on the inverted synchronous clock signal and the reference clock signal, and a second gate circuit for driving the N-channel MOS transistor based on the inverted reference clock signal and the synchronous clock signal.

The voltage controlled oscillator section may include a plurality of element pairs connected in series, wherein each of the plurality of element pairs includes an AND gate and a voltage controlled delay element. The AND gate has one of two input terminals which is connected to an inverted signal of the reset signal, the other input terminal which is connected to an output terminal of the voltage controlled delay element of a previous pair, and an output terminal which is connected to an input terminal of the voltage controlled delay element of the pair. Also, the output terminal of the voltage controlled delay element of a last pair is connected to the other input terminal of the AND gate of a head pair via an inverter circuit. The voltage controlled delay element delays a signal outputted from the output terminal of the pair by a predetermined delay time which is determined based on the control signal.

Each of the plurality of voltage controlled delay elements includes a buffer provided between the input terminal of the voltage controlled delay element and the output terminal thereof, a capacitor connected to a ground level, and a MOS transistor provided between the output terminal of the voltage controlled delay element and the capacitor, to charge or discharge the capacitor in response to the control signal.

Instead, the phase locked loop section may include a phase comparing section for generating a control signal based on a phase difference between the reference clock signal and a synchronous clock signal, a voltage controlled oscillator section for oscillating to generate the output clock signal in response to the control signal, wherein the voltage controlled oscillator section is reset in response to the reset signal such that the phase of the output clock signal is locked in the initial value, and a frequency dividing circuit for dividing the output clock signal in frequency to generate the synchronous clock signal, wherein the frequency dividing circuit is reset in response to the reset signal.

In this case, the phase comparing section makes a rising timing of the reference clock signal equal to that of the synchronous clock signal, outputs a pulse signal of a signal level for a time period for which a signal level of the synchronous clock signal and a signal level of the reference clock signal are different from each other, and holds the signal level of the outputted pulse signal for a time period for which the signal level of the synchronous clock signal is same as that of the reference clock signal. The phase comparing section includes a rising phase adjusting circuit for makes a rising timing of the reference clock signal equal to that of the synchronous clock signal, an output section composed of a P-channel MOS transistor and an N-channel MOS transistor which are connected in series between a power supply level and a ground level, wherein the output section outputs a signal indicative of the phase difference corresponding to the control signal when at least one of the P-channel MOS transistor and the N-channel MOS transistor is driven, first and second inverter circuits for inverting the synchronous clock signal and the reference clock signal, respectively, a first gate circuit for driving the P-channel MOS transistor based on the inverted synchronous clock signal and the reference clock signal, and a second gate circuit for driving the N-channel MOS transistor based on the inverted reference clock signal and the synchronous clock signal. The rising phase adjusting circuit includes a voltage controlled delay element for delaying the reference clock signal in response to a rising control signal, and a phase comparing circuit for detecting a phase difference between the synchronous clock signal and the reference clock signal delayed by the voltage controlled delay element to generate the rising control signal.

The voltage controlled oscillator section may be formed in the same manner as described above.

The frequency dividing circuit includes an inverter circuit, and a flip-flop circuit reset in response to the reset signal, the inverter circuit being connected such that an output of the flip-flop circuit is invertedly fed back to an input of the flip-flop circuit. The flip-flop circuit frequency divides an output of the inverter circuit in response to the output clock signal as a clock signal to generate the synchronous clock signal as the output of the flip-flop circuit.

In order to achieve another aspect of the present invention, a phase locked loop circuit includes a reset signal generating circuit for generating a reference clock signal from an input clock signal and generating a reset signal from the input clock signal for every predetermined time period, a phase comparing section for generating a control signal based on a phase difference between the reference clock signal and a synchronous clock signal, and a voltage controlled oscillator section for oscillating to generate an output clock signal in response to the control signal. The voltage controlled oscillator section is reset in response to the reset signal such that the phase of the output clock signal is locked in the initial value. A frequency dividing circuit divides the output clock signal in frequency to generate the synchronous clock signal.

In order to achieve still another aspect of the present invention, a phase locked loop circuit includes a reset signal generating circuit for generating a reference clock signal from an input clock signal and generating a reset signal from the input clock signal for every predetermined time period, a phase comparing section for generating a control signal based on a phase difference between the reference clock signal and a synchronous clock signal, a voltage controlled oscillator section for oscillating to generate an output clock signal in response to the control signal, wherein the voltage controlled oscillator section is reset in response to the reset signal such that the phase of the output clock signal is locked in the initial value, and a frequency dividing circuit for dividing the output clock signal in frequency to generate the synchronous clock signal, wherein the frequency dividing circuit is reset in response to the reset signal.

BRIEF DESCRIPTION OF THE DRAWINGS

FIGS. 16A and 16B are time charts illustrating the state which a phase detection error occurs; and FIGS. 17A and 17B are time charts illustrating the state which the phase detection error does not occur.

DESCRIPTION OF THE PREFERRED EMBODIMENTS

Next, a phase locked loop (PLL) circuit of the present invention will be described below in detail with reference to the attached drawings.

Figure 1:
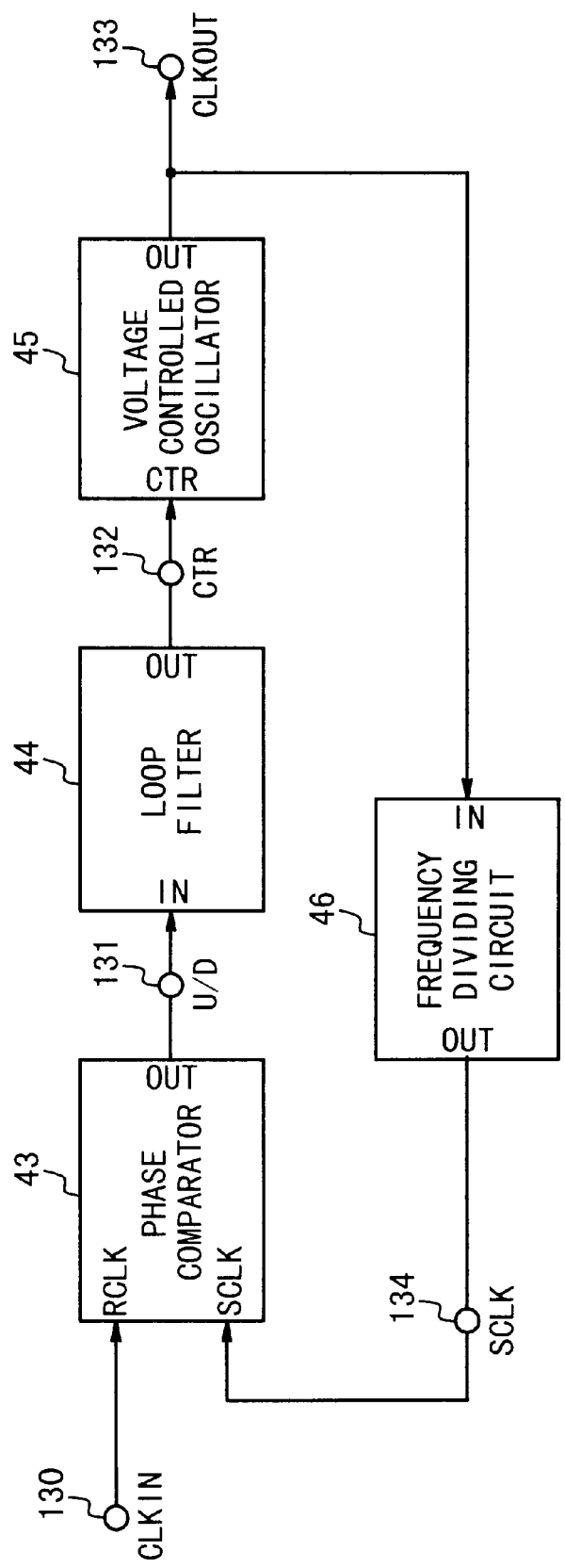
FIG. 1 is a block diagram illustrating the structure of a conventional phase locked loop circuit.
Figure 2:
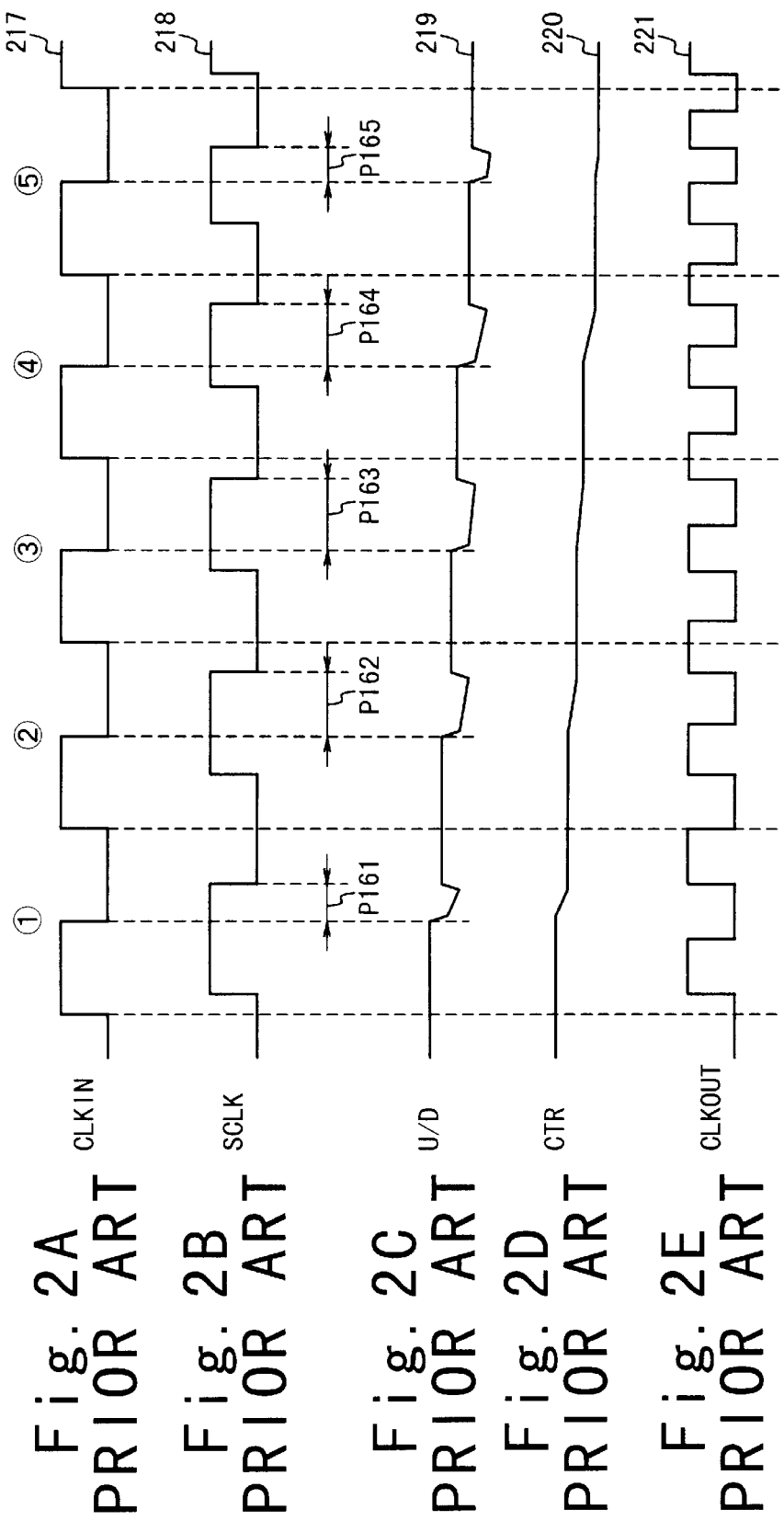
FIGS. 2A to 2E are time charts illustrating waveforms at terminals in the conventional phase locked loop circuit shown in FIG. 1.
Figure 3:
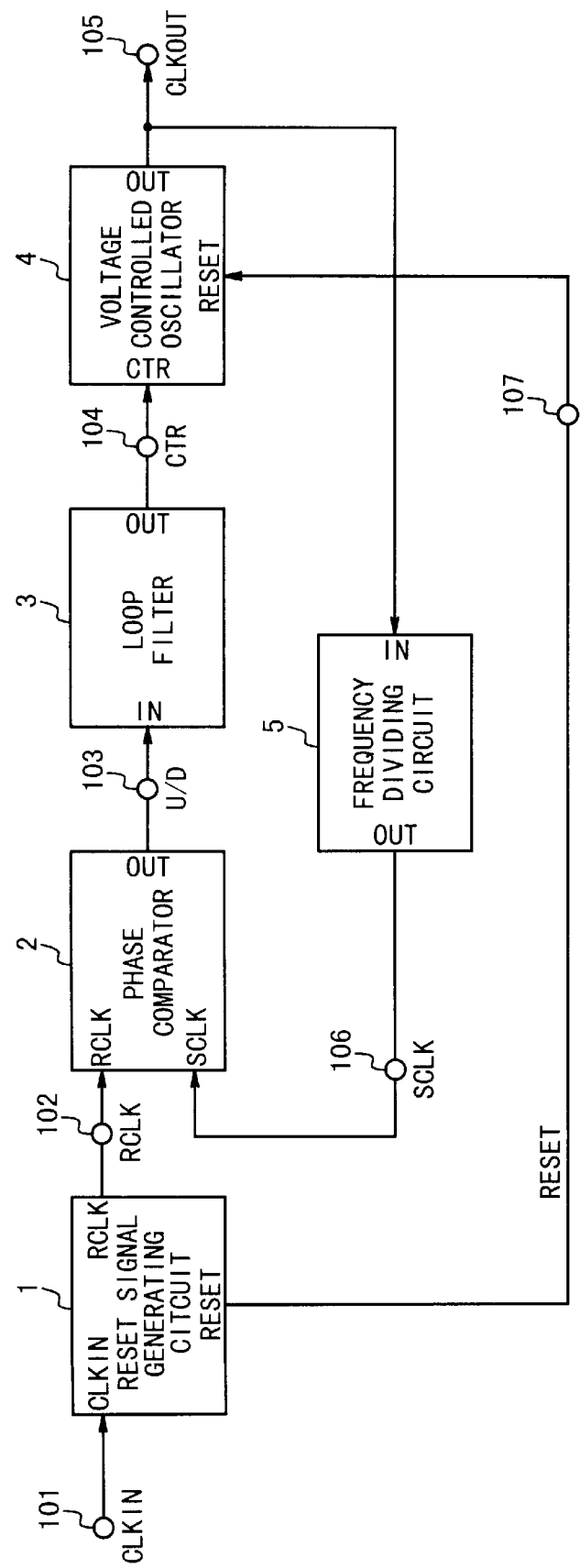
FIG. 3 is a block diagram illustrating the structure of the phase locked loop circuit according to a first embodiment of the present invention.

FIG. 3 is a block diagram illustrating the structure of the PLL circuit according to the first embodiment of the present invention. Referring to FIG. 3, the PLL circuit of the present invention is composed of a reset signal generating circuit 1, a pulse width difference detecting type phase comparator 2, a loop filter 3, a voltage controlled oscillator 4 and a frequency dividing circuit 5.

A terminal 101 is supplied with an input clock signal CLKIN and is connected to an input terminal of the reset signal generating circuit 1. A terminal 102 is connected to an output terminal of the reset signal generating circuit 1 for a reference clock signal, and to an input terminal of the phase comparator 2 for a reference clock signal. A terminal 107 is connected to an output terminal of the reset signal generating circuit 1 for a reset signal, and a terminal 106 is connected to an input terminal of the phase comparator 2 for a synchronous clock signal. A terminal 103 is connected to an output terminal of the phase comparator 2 for the phase difference signal U/D, and to the input terminal of the loop filter 3. A terminal 104 is connected to the output terminal of the loop filter 3, and to an input terminal of a voltage controlled oscillator 4 for a control signal. The terminal 107 is connected to an input terminal of the voltage controlled oscillator 4 for the reset signal. An output terminal of the voltage controlled oscillator 4 is connected to a terminal 105 and the signal which is given to the terminal 105 is the output clock signal CLKOUT. The terminal 105 is connected to an input terminal of the frequency dividing circuit 5 and an output terminal of the frequency dividing circuit 5 is connected to the terminal 106.

Next, the structure of the PLL circuit shown in the block in FIG. 3 will be described below in detail with reference to the drawings.

Figure 4:
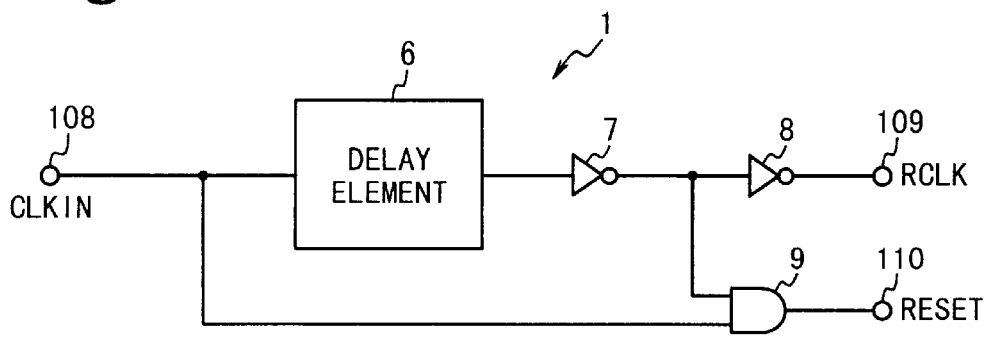
FIG. 4 is a block diagram illustrating the structure of a reset signal generating circuit in the phase locked loop circuit according to the first embodiment of the present invention.

FIG. 4 is a diagram illustrating the structure of the reset signal generating circuit 1 shown in FIG. 3. Referring to FIG. 4, the clock signal input terminal 108 to which the input clock signal CLKIN is supplied is connected to an input terminal of a delay element 6 and is connected to one of input terminals of an AND circuit 9. Also, the output terminal of the delay element 6 is connected to the input terminal of an inverter circuit 7 and the output terminal of the inverter circuit 7 is connected to an input terminal of an inverter circuit 8 and to the other of the input terminals of the AND circuit 9. An output terminal of the inverter circuit 8 is connected to a delay signal output terminal 109 to output the reference clock signal RCLK and an output terminal of the AND circuit 9 is connected to a reset signal output terminal 110 to output the reset signal RESER.

Next, the operation of the reset signal generating circuit 1 shown in FIG. 4 will be described below. The input clock signal CLKIN applied to the clock signal input terminal 108 passes through the delay element 6 so as to produce the reference clock signal with a delayed phase from that of the input clock signal CLKIN. A logical product of an inverted signal obtained by inverting the reference clock signal by the inverter circuit 7 and the input clock signal is calculated by the AND circuit 9. Thus, a pulse reset signal RESET can be obtained to have the pulse width substantially equal to the delay time. This signal RESET is outputted from the reset signal output terminal to the voltage controlled oscillator 4. The reference clock signal RCLK is outputted from the reference clock signal output terminal to the phase comparator 2.

Figure 5:
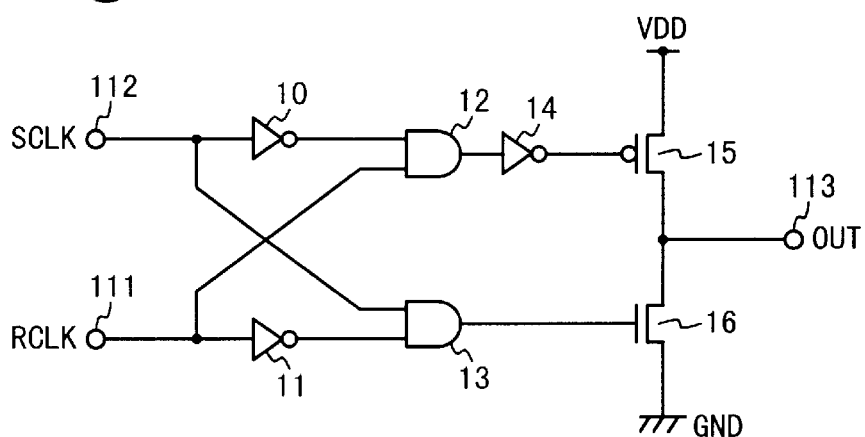
FIG. 5 is a block diagram illustrating the structure of a phase comparator in the phase locked loop circuit according to the first embodiment of the present invention.

FIG. 5 is a diagram illustrating the structure of the phase comparator 2 of a pulse width difference detection type shown in FIG. 3. Referring to FIG. 5, an input terminal 111 for the reference clock signal RCLK is connected to an input terminal of an inverter circuit 11 and one of input terminals of an AND circuit 12. Also, an input terminal 112 for the synchronous clock signal SCLK is connected to an input terminal of an inverter circuit 10 and one of input terminals of an AND circuit 13. An output terminal of the inverter circuit 10 is connected to an input terminal of the other input terminal of the AND circuit 12 and an output terminal of the inverter circuit 11 is connected to the other input terminal of the AND circuit 13. An output terminal of the AND circuit 12 is connected to an input terminal of an inverter circuit 14 and an output terminal of the inverter circuit 14 is connected to the gate terminal of a PMOS transistor 15. An output terminal of the AND circuit 13 is connected to the gate terminal of an NMOS transistor 16. The source terminal of the PMOS transistor 15 is connected to a power supply voltage level VDD and the source terminal of the NMOS transistor 16 is connected to the ground level GND. The drain terminal of the PMOS transistor 15 and the drain terminal of the NMOS transistor 16 is connected in common to an output terminal 113 for the phase difference signal U/D.

Next, the operation of the phase comparator 2 of the pulse width difference detection type shown in FIG. 5 will be described below. When the potential of the reference clock signal input terminal 111 is in a High level and the potential of the synchronous clock signal input terminal 112 is a Low level, the output of the AND circuit 12 becomes the High level. Thus, the PMOS transistor 15 is turned one so that the output terminal 113 is set to the High level.

When the potential of reference clock signal input terminal 111 is in the Low level and the potential of the synchronous clock signal input terminal 112 is the High level, the output of the AND circuit 13 becomes the High level. Then, the NMOS transistor 16 is turned on so that the output terminal 113 is set to the Low level.

When the potential of the reference clock signal input terminal 111 is equal to the potential of the synchronous clock signal input terminal 112, the output terminal 113 is set to a high impedance state. In other words, the output signal is set to the High level or the Low level during the time period which is proportional to the time difference between the pulse width of the reference clock signal and the pulse width of the synchronous clock signal. When the two input signals has the same potential level, the output terminal 113 is set to the high impedance state so as to maintain the output potential before the two input signals becomes equal to each other. With such an operation, the output pulse signal determined in accordance with the pulse width difference between the reference clock signal RCLK and the synchronous clock signal SCLK can be obtained.

Figure 6:
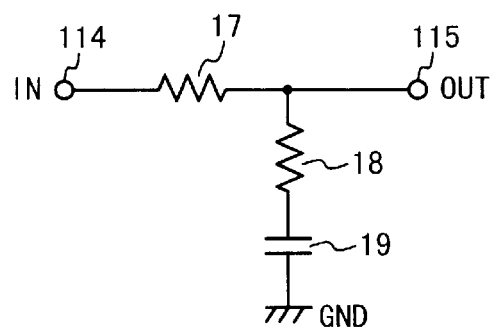
FIG. 6 is a block diagram illustrating the structure of a loop filter in the phase locked loop circuit according to the first embodiment of the present invention.

FIG. 6 is a diagram illustrating the structure of the loop filter 3 shown in FIG. 3. Referring to FIG. 6, an input terminal 114 to which the phase difference signal is supplied is connected to one end of a resistance 17 and the other end of the resistance 17 is connected to an output terminal 115 so as to output the delay time control signal CTR. Also, one end of a resistance 18 is connected to the output terminal 115 and the other end of the resistance 18 is connected to one end of a capacity 19. The other end of the capacity 19 is connected to the ground level GND. The loop filter 3 forms a well-known low-pass filter to remove a high frequency component of the phase difference signal which is applied to the input terminal 114 and outputs the filtered signal as the control signal CTR to the output terminal 115.

Figure 7:
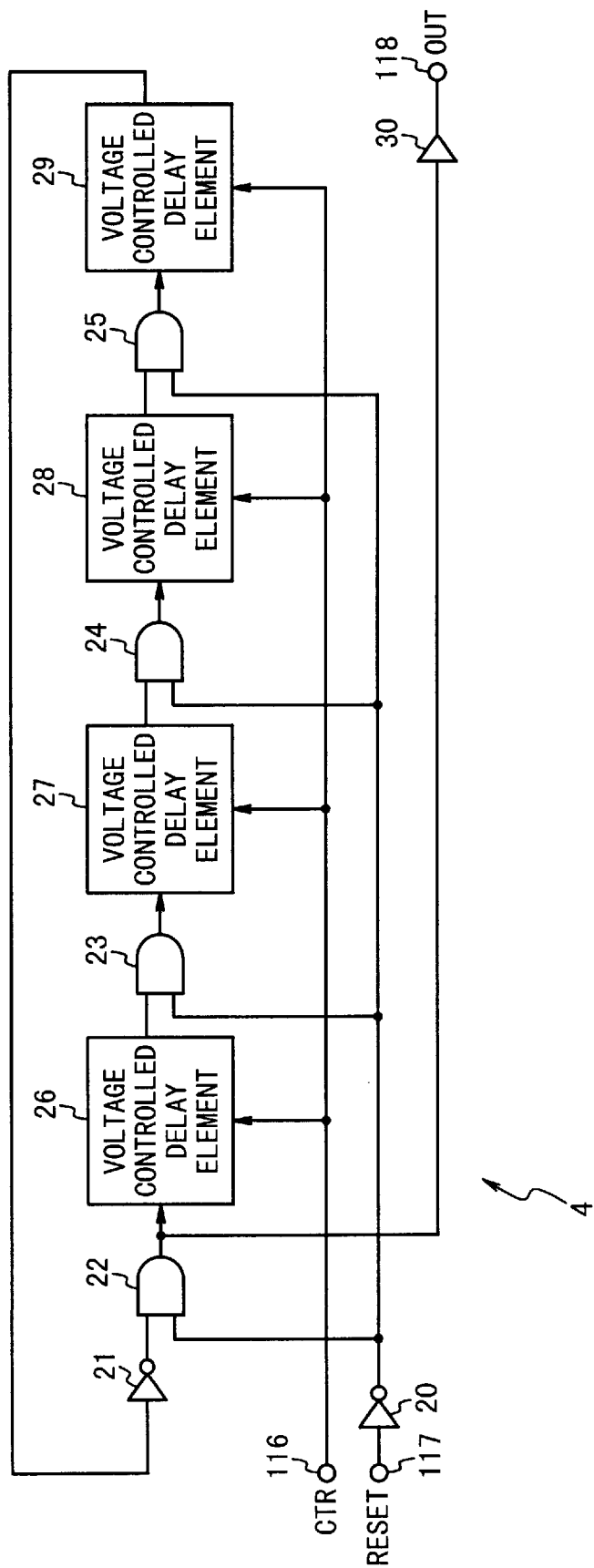
FIG. 7 is a block diagram illustrating the structure of a voltage controlled oscillator in the phase locked loop circuit according to the first embodiment of the present invention.

FIG. 7 is a diagram illustrating the structure of the voltage controlled oscillator 4 shown in FIG. 3. Referring to FIG. 7, the voltage controlled oscillator 4 is composed of a plurality of AND circuits 22 to 25, a plurality of voltage controlled delay elements 26 to 29, a plurality of inverter circuits 20 and 21 and a buffer circuit 30. An input terminal 116 for the delay time control signal CTR is connected to input terminals of the voltage controlled delay elements 26 to 29. An input terminal 117 for the reset signal RESET is connected to an input terminal of an inverter circuit 20 and an output terminal of the inverter circuit 20 is connected to one of input terminals of each of the AND circuits 22 to 25. The output terminals of the AND circuits 22 to 25 are connected to delay signal input terminals of the voltage controlled delay element 26 to 29, respectively, and delay signal output terminals of the voltage controlled delay elements 26 to 28 are connected to the other input terminal of each of the AND circuit 23 to 25. The delay signal output terminal of the voltage controlled delay element 29 is connected to an input terminal of the inverter circuit 21 and an output terminal of the inverter circuit 21 is connected to the other input terminal of the AND circuit 22. The output terminal of the AND circuit 22 is connected to an input terminal of the buffer circuit 30, and an output terminal of the buffer circuit 30 is connected to an output terminal 118 for the output clock signal CLKOUT.

Next, the operation of the voltage controlled oscillator 4 shown in FIG. 7 will be described below.

Each of the voltage controlled delay elements 26 to 29 delays a signal supplied to the input terminal based on the delay time control signal CTR. When the potential of the reset signal input terminal 117 is in the Low level, each of the AND circuits 22 to 25 outputs a signal supplied to the other input terminal just as it is. Therefore, the inverter circuit 21, the AND circuits 22 to 25 and the voltage controlled delay elements 26 to 29 are formed as the negative feed back loop. The loop oscillates to output the output clock signal CLKOUT to the output terminal 118.

The time period of the output clock signal CLKOUT is determined based on the summation of the delay time of the voltage controlled delay elements, the delay time of the AND circuits, and the delay time of the inverter circuit which form the loop. Because the time period of the output clock signal CLKOUT becomes twice of the summation in this embodiment, the time period changes based on the potential of the control signal CTR at the input terminal 116. When the potential of the reset signal input terminal 117 is in the High level, the outputs of the AND circuits 22 to 25 are all in the Low level. The potential of the output terminal 118 is also set to the Low level. At this time, after the time period corresponding to the delay times of the voltage controlled delay elements 26 to 29 elapses, the output terminals of each of the voltage controlled delay elements 26 to 29 is set to the potential level of the signal at the input terminal of the voltage control delay element. In other words, the internal state of the voltage controlled oscillator can be set to the initial state when the potential of the reset input terminal 117 is set to the High level.

Figure 8:
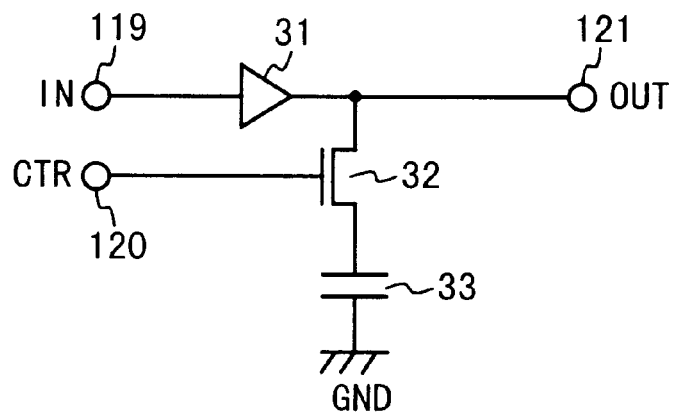
FIG. 8 is a block diagram illustrating the structure of a voltage controlled delay element in the phase locked loop circuit according to the first embodiment of the present invention.

FIG. 8 is a diagram illustrating the structure of each of the voltage controlled delay element 26 to 29 shown in FIG. 7. Referring to FIG. 8, an input terminal of the buffer circuit 31 is connected to a delay signal input terminal 119 to which the output of the corresponding one of the AND gates 22 to 25 is supplied. An output terminal of the buffer circuit 31 is connected to a delay signal output terminal 121 which is connected to the input terminal of the next one of the AND gates 22 to 25, and is connected to the drain terminal of an NMOS transistor 32. A delay time control input terminal 120 is connected to the gate terminal of the NMOS transistor 32 and the source terminal of the NMOS transistor 32 is connected to one end of a capacity 33. The other end of the capacity 33 is connected to the ground level GND. Therefore, the buffer circuit 31 and the capacity 33 form a delay circuit by a time constant circuit.

Figure 9:
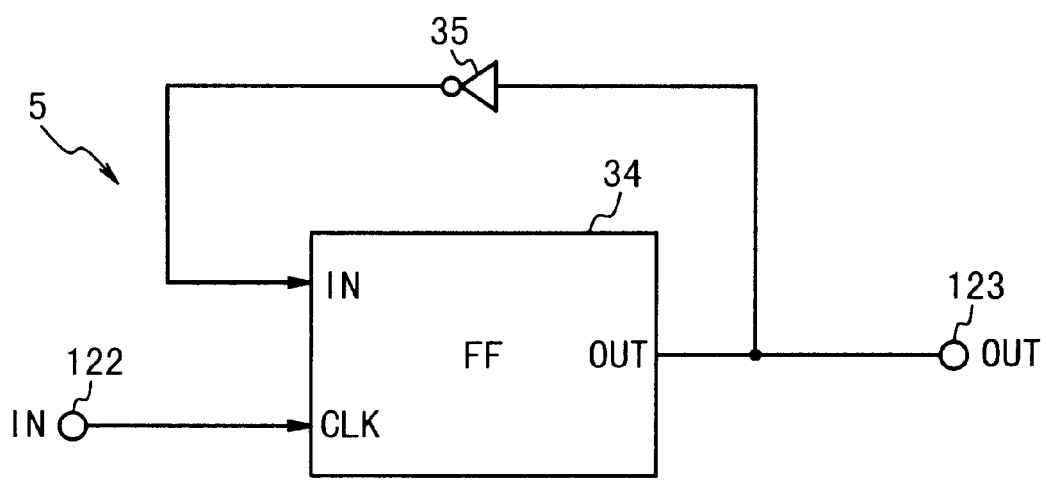
FIG. 9 is a block diagram illustrating the structure of a frequency dividing circuit in the phase locked loop circuit according to the first embodiment of the present invention.
Figure 10:
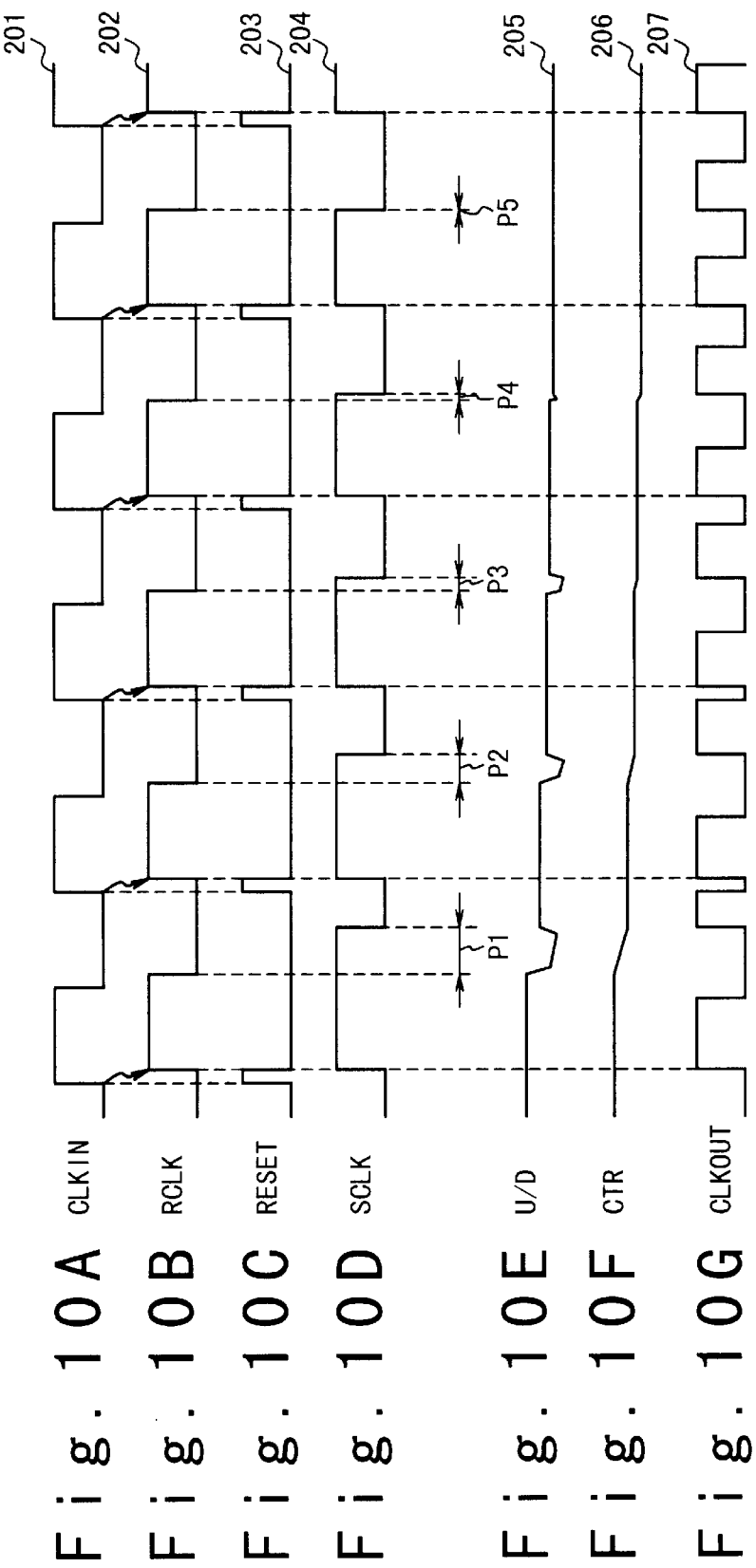
FIGS. 10A to 10G are time charts illustrating the operation of the phase locked loop circuit according to the first embodiment of the present invention.

FIG. 9 is a diagram illustrating the structure example of the frequency dividing circuit 5 in FIG. 3. Referring to FIG. 9, an input terminal 122 to which the output clock signal CLKOUT is supplied is connected to a clock signal input terminal of a flip-flop circuit 34. A signal output terminal of the flip-flop circuit 34 is connected to an output terminal 123 for the synchronous clock signal SCLK and an input terminal of an inverter circuit 35. An output terminal of the inverter circuit 35 is connected to a signal input terminal of the flip-flop circuit 34. For example, a well-known D-type flip-flop can be used as the flip-flop circuit 34. The frequency dividing circuit 5 is a ½ frequency dividing circuit, and frequency divides the frequency of the output clock signal CLKOUT which is inputted to the input terminal 122 to the frequency of ½ to output to the output terminal 123.

The operations of the respective sections will be described below with reference to the drawings.

FIGS. 10A to 10G are time charts illustrating the waveforms at the terminals shown in FIG. 3. The waveform 201 shows the waveform at the terminal 101, the waveform 202 shows the waveform at the terminal 102, the waveform 203 shows the waveform at the terminal 107, the waveform 204 shows the waveform at the terminal 106, the waveform 205 shows the waveform at the terminal 103, the waveform 206 shows the waveform at the terminal 104, and the waveform 207 shows the waveform at the terminal 105.

Also, when the input clock signal CLKIN is given to the terminal 101 as shown by the waveform 202, the reference clock signal RCLK is obtained at the terminal 102 to have a predetermined delay time to the waveform 201. Also, as shown by the waveform 203, the pulse reset signal RESET is obtained at the terminal 107 to have the pulse width corresponding to the phase difference between the waveform 201 and the waveform 202. When the reset signal RESET which is given to the voltage controlled oscillator 4 is set to the High level, the voltage controlled oscillator 4 is reset so that the output clock signal CLKOUT is set to the Low level.

Next, when the reset signal RESET is set to the Low level, the output clock signal CLKOUT is immediately set to the High level, since the voltage controlled delay element 29 outputs a Low level signal. Then, the voltage controlled oscillator 4 starts oscillation so that the output clock signal CLKOUT has the waveform 207. The output clock signal CLKOUT is frequency divided by the frequency dividing circuit 5. As a result, the synchronous clock signal SCLK is obtained at the terminal 106 as shown by the waveform 204. The differences between the reference clock signal RCLK shown by the waveform 202 and the synchronous clock signal SCLK shown by the waveform 204 in pulse width of high level are shown as phase differences P1 to P5. The signal which has the width proportional to this phase difference is generated by the phase comparator 2. As a result, the phase difference signal U/D which has the waveform 205 is given to the terminal 103. The high frequency component of this phase difference signal U/D is removed by the loop filter 3, and the resultant signal is given to the terminal 104 as the control signal CTR for the voltage controlled oscillator 4. This resultant signal has the waveform 206.

When the time period of the synchronous clock signal SCLK in the High level is longer than that of the reference clock signal RCLK, in other words, when the phase is delayed, the phase difference signal U/D is set as a pulse signal of the Low level. As a result, the potential of the control signal CTR decreases. For this reason, the delay times of the voltage controlled delay elements of the voltage controlled oscillator 4 decreases and the time period of the output clock signal CLKOUT becomes short with the decrease. As a result, the phase delay of the synchronous clock signal decreases and the phase difference due to the phase delay also decreases gradually. Thus, the potential of the control signal CTR is controlled to eliminate the phase difference.

Also, on the contrary, when the time period of the synchronous clock signal SCLK in the High level is shorter than that of the reference clock signal RCLK, in other words, when the phase is precede, the phase difference signal U/D is set as a pulse signal of the High level. As a result, the potential of the control signal CTR increases. For this reason, the delay times of the voltage controlled delay elements of the voltage controlled oscillator 4 increase. As a result, the time period of the output clock signal CLKOUT becomes long. Therefore, the phase delay of the reference clock signal RCLK decreases. Thus, the phase difference also decreases gradually.

After all, the phase of the reference clock signal RCLK is coincident with that of the synchronous clock signal SCLK through these processes. As a result, the output clock signal CLKOUT is the clock signal obtained by frequency multiplying the input clock signal CLKIN.

Figure 11:
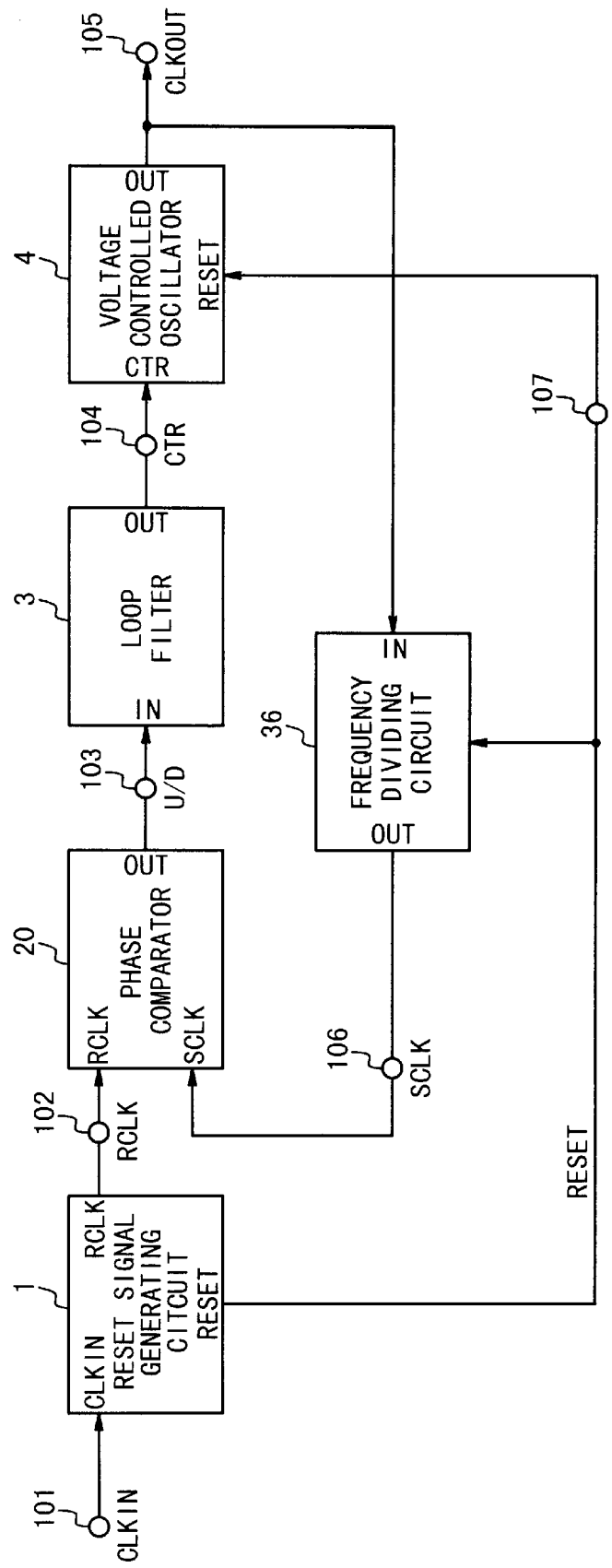
FIG. 11 is a block diagram illustrating the structure of the phase locked loop circuit according to a second embodiment of the present invention.

FIG. 11 is a block diagram illustrating the structure of the PLL circuit according to the second embodiment of the present invention. The difference between the PLL circuit in the first embodiment and the PLL circuit in the second embodiment is in that the frequency dividing circuit 5 is replaced by a frequency dividing circuit 36 with a reset function, and that the reset signal RESET is connected to a reset input terminal of the frequency dividing circuit 36.

Figure 12:
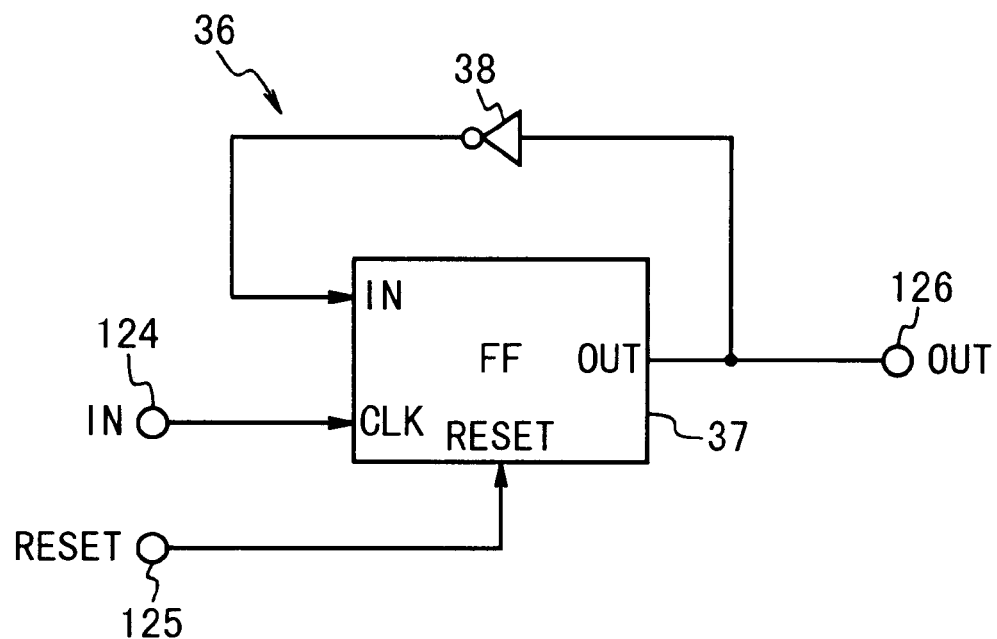
FIG. 12 is a block diagram illustrating the structure of a frequency dividing circuit in the phase locked loop circuit according to the second embodiment of the present invention.
Figure 13:
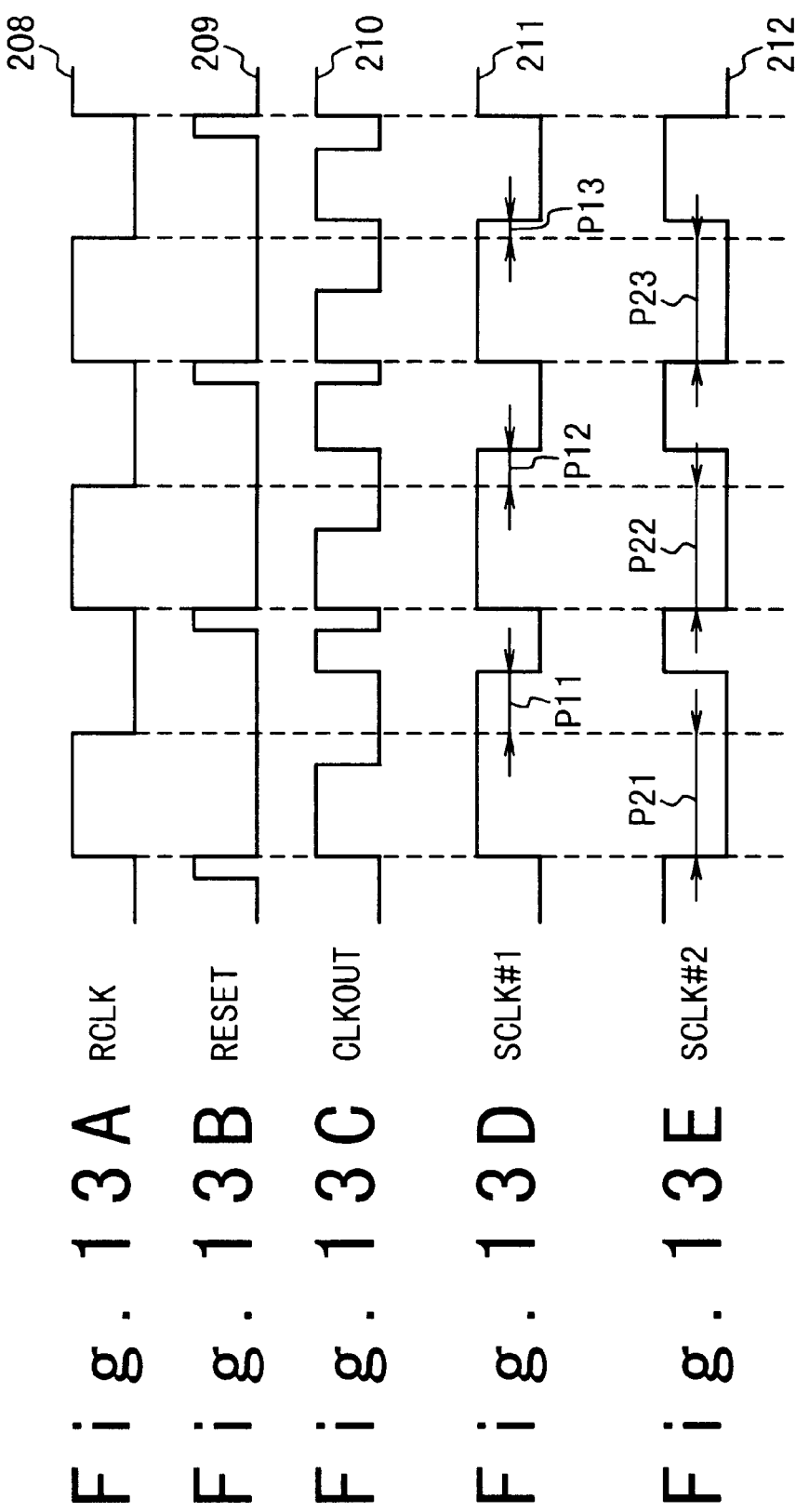
FIGS. 13A to 13E are time charts illustrating the operations of the phase locked loop circuit according to the second embodiment of the present invention when a timing shift is not brought about in the frequency dividing circuit and when the timing shift is brought about in the frequency dividing circuit.

FIG. 12 is a block diagram illustrating the structure of the frequency dividing circuit 36 with the reset function. Referring to FIG. 12, the synchronous clock signal SCLK is the signal obtained by frequency dividing the output clock signal CLKOUT. When the timing of the reset and the timing of the divided synchronous clock signal SCLK are shifted from each other, there is possibility that an erroneous phase difference is detected. FIGS. 13A to 13E show the waveforms when the synchronous clock signal SCLK is coincident with the reset signal RESET in timing and when it is not coincident. In FIGS. 13A to 13E, the waveform when timings are fit to each other is shown as the waveform 210 and the waveform when timings are not fit to each other is shown as the waveform 211. When the synchronous clock signal SCLK#1 shown by the waveform 211 is fit to the reset signal RESET in transition timing, it could be seen that the phase difference is right obtained. On the other hand, when the synchronous clock signal SCLK#2 shown by the waveform 212 is not fit to the reset signal RESET in transition timing, it could be seen that the phase difference is not right obtained. Therefore, by giving the reset signal RESET to the frequency dividing circuit 36 to correct the transition timing regularly, the phase shift from the reset signal RESET can be prevented. Therefore, as shown in FIG. 12 and FIGS. 13A to 13E, the flip-flop circuit 37 in the frequency dividing circuit 36 is reset in response to the reset signal RESET.

Figure 14:
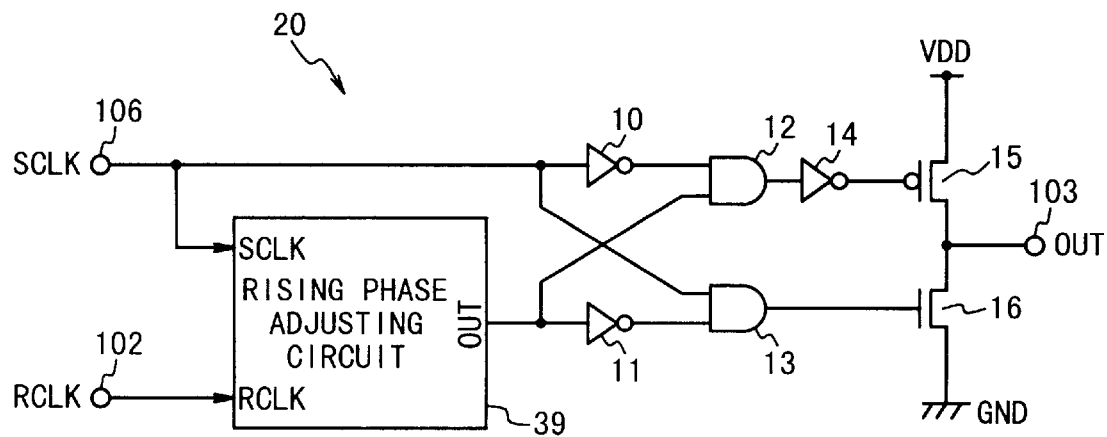
FIG. 14 is a block diagram illustrating the structure of a phase comparator in the phase locked loop circuit according to the second embodiment of the present invention.

FIG. 14 is a diagram illustrating the structure of phase comparator 20 in FIG. 11. Referring to FIG. 14, the different point between the phase comparator shown in FIG. 5 and the phase comparator shown in this figure is in that a rising phase adjusting circuit 29 is connected to the reference clock signal input terminal 111 and the synchronous clock signal input terminal 112. The output terminal of the rising phase adjusting circuit 29 is connected to the node to which the reference clock signal input terminal was connected in FIG. 5, i.e., the input terminal of the inverter 11, and the node to which one of the input terminals of the AND circuit 12 is connected.

Figure 15:
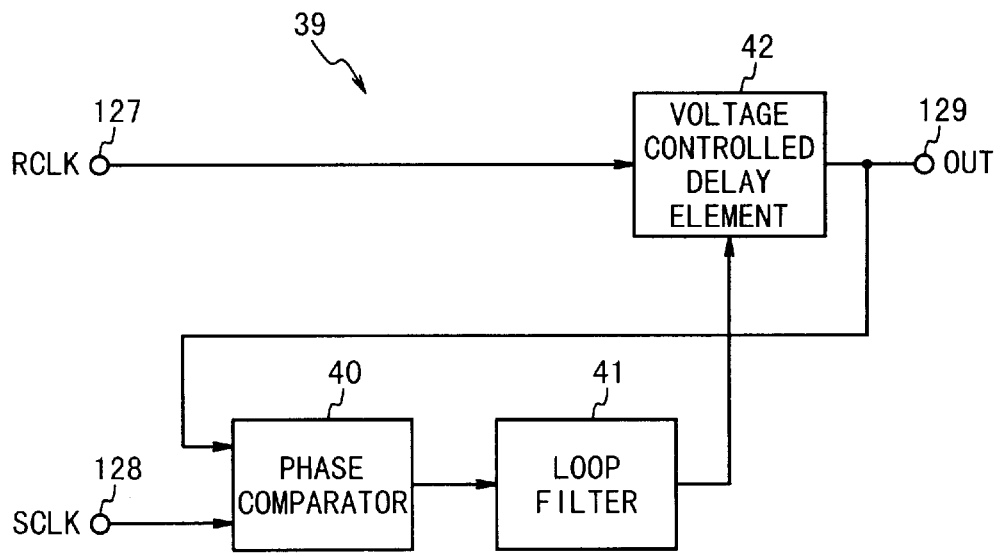
FIG. 15 is a block diagram illustrating the structure of a rising phase adjusting circuit in the phase locked loop circuit according to the second embodiment of the present invention.

FIG. 15 is a block diagram illustrating the structure of the rising phase adjusting circuit 39. As shown in FIG. 15, the rising phase adjusting circuit 39 is composed of the phase comparator 40 which compares only rising phases, a loop filter 41 and a voltage controlled delay element 42.

A input terminal 127 for the reference clock signal RCLK is connected to an input terminal of the voltage controlled delay element 42. The output terminal of the voltage controlled delay element 42 is connected to an output terminal 129 which is connected to the inverter 11 and the AND gate 12. Also, the output terminal of the voltage controlled delay element 42 is connected to one of input terminals of the phase comparator 40. The input terminal 128 for the synchronous clock signal SCLK is connected to the other input terminal of the phase comparator 40. The output terminal of the phase comparator 40 is connected to an input terminal of the loop filter 41. An output terminal of the loop filter 41 is connected to a delay time control signal input terminal of the voltage controlled delay element 42.

In such a structure, when the rising timing of the waveform of the synchronous clock signal at the input terminal 128 is precede to or delayed from the rising timing of the waveform of the clock signal at the output terminal 129, the phase difference is detected by the phase comparator 40. The high frequency component of the signal indicative of the phase difference is removed by the loop filter 41, in the same manner shown in FIG. 3. Then, a delay time control signal is controlled in such a manner that the delay time of the voltage controlled delay element 42 is made small. In this manner, the phase comparator 40 operates such that the phase of the rising timing of the clock signal at the output terminal 129 and the clock signal at the synchronous clock signal input terminal 128 is equal to each other.

FIGS. 16A and 16B show a relation of the reference clock signal RCLK and the synchronous clock signal SCLK. In FIGS. 16A and 16B, when the delay time of the frequency dividing circuit 5 or the frequency dividing circuit 36 is zero, it could be considered that the rising timing of the reference clock signal RCLK and the rising timing of the synchronous clock signal SCLK are substantially equal to each other, because the rising timings are brought about in response to the rising timing of the reset signal RESET.

In this case, as shown in FIG. 16A, the reference clock signal RCLK and the synchronous clock signal SCLK is equal to each other in the rising timing and the difference between the clock signals in the pulse width should become a phase difference just as it is. However, as shown in FIGS.

17A and 17B, when the delay time of the frequency dividing circuit 5 or frequency dividing circuit 36 is large, the rising timing of the reference clock signal RCLK and the rising timing of the synchronous clock signal SCLK are shifted from each other. In this case, the delay time of the frequency dividing circuit is added to the time which is equivalent to the difference in the pulse width of both clock signals, so that the phase difference cannot be right detected. Therefore, when the phase comparator is formed as shown in FIG. 14, it is possible to make the rising timing of the reference clock signal RCLK and the rising timing of the synchronous clock signal SCLK fit to each other. Therefore, the delay time of the frequency dividing circuit can be removed and the phase difference can be detected more correctly.

As mentioned above, according to the present invention, the reliability of the PLL circuit to the change of the external parameters such as a power supply voltage and temperature can be improved. Therefore, the PLL circuit of the present invention can be operated in the operation condition which is wider than the above conventional PLL circuit.

As described above, according to the PLL circuit of the present invention, a reset signal is generated for every predetermined time period. A phase difference between the reference input signal and the oscillation output signal is set to zero in response to the reset signal. As a result, the PLL circuit can operate in a stable state even if the external parameters such as the power supply voltage and then ambient temperature change.

In the PLL circuit of the present invention, a phase difference between the input clock signal and the output clock signal is removed regularly. More specifically, a reset signal is generated from an input clock signal and the phase delay quantity of the voltage controlled oscillator is initialized in response to the generated reset signal. In other words, the voltage controlled oscillator is regularly reset in response to the reset signal which is generated from the input clock signal. Therefore, a phase integration component which is accumulated by the voltage controlled oscillator is removed, and the phase delay decreases. For this reason, a phase margin increases, and as a result, the reliability of the PLL circuit to the external parameters can be improved.

What is claimed is:

1. A phase locked loop circuit comprising:
   a reset signal generating circuit for generating a reference clock signal and a reset signal from an input clock signal; and
   a phase locked loop section for generating an output clock signal based on said reference clock signal such that a phase of said output clock signal is locked in that of said reference clock signal, wherein said phase locked loop section is reset in response to said reset signal such that said phase of said output clock signal is adjusted to an initial value.

2. A phase locked loop circuit according to claim 1, wherein said reset signal generating circuit generates said reset signal in a predetermined time period.

3. A phase locked loop circuit according to claim 2, wherein said predetermined time period is substantially same as a time period of said reference clock signal.

4. A phase locked loop circuit according to claim 1, wherein said reset signal generating circuit comprises:
   a delay element section for delaying said input clock signal to generate said reference clock signal; and
   a gate circuit for generating said reset signal from said input clock signal and the delayed input clock signal.

5. A phase locked loop circuit according to claim 1, wherein said phase locked loop section comprises:

a phase comparing section for generating a control signal based on a phase difference between said reference clock signal and a synchronous clock signal;
   a voltage controlled oscillator section for oscillating to generate said output clock signal in response to said control signal, wherein said voltage controlled oscillator section is reset in response to said reset signal such that said phase of said output clock signal is adjusted to said initial value; and
   a frequency dividing circuit for dividing said output clock signal in frequency to generate said synchronous clock signal.

6. A phase locked loop circuit according to claim 5, wherein said phase comparing section outputs a pulse signal of a signal level for a time period for which a signal level of said synchronous clock signal and a signal level of said reference clock signal are different from each other, and holds the signal level of the outputted pulse signal for a time period for which the signal level of said synchronous clock signal is same as that of said reference clock signal.

7. A phase locked loop circuit according to claim 6, wherein said phase comparing section comprises:
   an output section composed of a P-channel MOS transistor and an N-channel MOS transistor which are connected in series between a power supply level and a ground level, wherein said output section outputs a signal indicative of said phase difference corresponding to said control signal when at least one of said P-channel MOS transistor and said N-channel MOS transistor is driven;
   first and second inverter circuits for inverting said synchronous clock signal and said reference clock signal, respectively;
   a first gate circuit for driving said P-channel MOS transistor based on the inverted synchronous clock signal and said reference clock signal; and
   a second gate circuit for driving said N-channel MOS transistor based on the inverted reference clock signal and said synchronous clock signal.

8. A phase locked loop circuit according to claim 5, wherein said voltage controlled oscillator section comprises:
   a plurality of element pairs connected in series, wherein each of said plurality of element pairs includes an AND gate and a voltage controlled delay element, and
   wherein said AND gate has one of two input terminals which is connected to an inverted signal of said reset signal, the other input terminal which is connected to an output terminal of said voltage controlled delay element of a previous pair, and an output terminal which is connected to an input terminal of said voltage controlled delay element of said pair, and
   wherein said output terminal of said voltage controlled delay element of a last pair is connected to the other input terminal of said AND gate of a head pair via an inverter circuit, and
   wherein said voltage controlled delay element delays a signal outputted from said output terminal of said pair by a predetermined delay time which is determined based on said control signal.

9. A phase locked loop circuit according to claim 8, wherein each of said plurality of voltage controlled delay elements comprises:
   a buffer provided between said input terminal of said voltage controlled delay element and said output terminal thereof;

a capacitor connected to a ground level; and a MOS transistor provided between said output terminal of said voltage controlled delay element and said capacitor, to charge or discharge said capacitor in response to said control signal.

10. A phase locked loop circuit according to claim 1, wherein said phase locked loop section comprises:

a phase comparing section for generating a control signal based on a phase difference between said reference clock signal and a synchronous clock signal;

a voltage controlled oscillator section for oscillating to generate said output clock signal in response to said control signal, wherein said voltage controlled oscillator section is reset in response to said reset signal such that said phase of said output clock signal is adjusted to said initial value; and a frequency dividing circuit for dividing said output clock signal in frequency to generate said synchronous clock signal, wherein said frequency dividing circuit is reset in response to said reset signal.

11. A phase locked loop circuit according to claim 10, wherein said phase comparing section makes a rising timing of said reference clock signal equal to that of said synchronous clock signal, outputs a pulse signal of a signal level for a time period for which a signal level of said synchronous clock signal and a signal level of said reference clock signal are different from each other, and holds the signal level of the outputted pulse signal for a time period for which the signal level of said synchronous clock signal is same as that of said reference clock signal.

12. A phase locked loop circuit according to claim 11, wherein said phase comparing section comprises:

a rising phase adjusting circuit makes a rising timing of said reference clock signal equal to that of said synchronous clock signal;

an output section composed of a P-channel MOS transistor and an N-channel MOS transistor which are connected in series between a power supply level and a ground level, wherein said output section outputs a signal indicative of said phase difference corresponding to said control signal when at least one of said P-channel MOS transistor and said N-channel MOS transistor is driven;

first and second inverter circuits for inverting said synchronous clock signal and said reference clock signal, respectively;

a first gate circuit for driving said P-channel MOS transistor based on the inverted synchronous clock signal and said reference clock signal; and a second gate circuit for driving said N-channel MOS transistor based on the inverted reference clock signal and said synchronous clock signal.

13. A phase locked loop circuit according to claim 12, wherein said rising phase adjusting circuit comprises:

a voltage controlled delay element for delaying said reference clock signal in response to a rising control signal; and a phase comparing circuit for detecting a phase difference between said synchronous clock signal and the reference clock signal delayed by said voltage controlled delay element to generate said rising control signal.

14. A phase locked loop circuit according to claim 10, wherein said voltage controlled oscillator section comprises:

a plurality of element pairs connected in series, wherein each of said plurality of element pairs includes an AND gate and a voltage controlled delay element, and wherein said AND gate has one of two input terminals which is connected to an inverted signal of said reset signal, the other input terminal which is connected to an output terminal of said voltage controlled delay element of a previous pair, and an output terminal which is connected to an input terminal of said voltage controlled delay element of said pair, and wherein said output terminal of said voltage controlled delay element of a last pair is connected to the other input terminal of said AND gate of a head pair via an inverter circuit, and wherein said voltage controlled delay element delays a signal outputted from said output terminal of said pair by a predetermined delay time which is determined based on said control signal.

15. A phase locked loop circuit according to claim 14, wherein each of said plurality of voltage controlled delay elements comprises:

a buffer provided between said input terminal of said voltage controlled delay element and said output terminal thereof;

a capacitor connected to a ground level; and a MOS transistor provided between said output terminal of said voltage controlled delay element and said capacitor, to charge or discharge said capacitor in response to said control signal.

16. A phase locked loop circuit according to claim 10, wherein said frequency dividing circuit comprises:

an inverter circuit; and a flip-flop circuit reset in response to said reset signal, said inverter circuit being connected such that an output of said flip-flop circuit is inversely fed back to an input of said flip-flop circuit, and wherein said flip-flop circuit frequency divides an output of said inverter circuit in response to said output clock signal as a clock signal to generate said synchronous clock signal as the output of said flip-flop circuit.

17. A phase locked loop circuit comprising:

a reset signal generating circuit for generating a reference clock signal from an input clock signal and generating a reset signal from said input clock signal for every predetermined time period;

a phase comparing section for generating a control signal based on a phase difference between said reference clock signal and a synchronous clock signal;

a voltage controlled oscillator section for oscillating to generate an output clock signal in response to said control signal, wherein said voltage controlled oscillator section is reset in response to said reset signal such that said phase of said output clock signal is adjusted to an initial value; and a frequency dividing circuit for dividing said output clock signal in frequency to generate said synchronous clock signal.

18. A phase locked loop circuit according to claim 17, wherein said reset signal generating circuit comprises:

a delay element section for delaying said input clock signal to generate said reference clock signal; and a gate circuit for generating said reset signal from said input clock signal and the delayed input clock signal.

19. A phase locked loop circuit comprising:

a reset signal generating circuit for generating a reference clock signal from an input clock signal and generating a reset signal from said input clock signal for every predetermined time period;

a phase comparing section for generating a control signal based on a phase difference between said reference clock signal and a synchronous clock signal;

a voltage controlled oscillator section for oscillating to generate an output clock signal in response to said control signal, wherein said voltage controlled oscillator section is reset in response to said reset signal such that said phase of said output clock signal is adjusted to an initial value; and a frequency dividing circuit for dividing said output clock signal in frequency to generate said synchronous clock signal, wherein said frequency dividing circuit is reset in response to said reset signal.

20. A phase locked loop circuit according to claim 19, wherein said reset signal generating circuit comprises:

a delay element section for delaying said input clock signal to generate said reference clock signal; and a gate circuit for generating said reset signal from said input clock signal and the delayed input clock signal.

* * * * *